United States Patent [19]
Worp

[11] Patent Number: 5,749,049
[45] Date of Patent: May 5, 1998

[54] METHOD AND APPARATUS FOR MEASURING THE INHERENT CAPACITANCE OF A CIRCUIT SUPPORTING SUBSTRATE

[76] Inventor: Nicholas Jacob Worp, 6776 Paul Mar Dr., Lantana, Fla. 33462

[21] Appl. No.: 18,132

[22] Filed: Feb. 16, 1993

Related U.S. Application Data

[62] Division of Ser. No. 786,675, Nov. 1, 1991, abandoned.

[51] Int. Cl.$^6$ ............................................. H04B 17/00
[52] U.S. Cl. ...................... 455/226.1; 455/351; 324/537; 324/519
[58] Field of Search .................... 455/226.1, 351, 455/38.1; 324/537, 519, 554

[56] References Cited

U.S. PATENT DOCUMENTS

| | | | |
|---|---|---|---|
| 3,264,537 | 8/1966 | Delaney | 361/321 R |
| 3,668,523 | 6/1972 | Kuhn | 324/676 |
| 3,775,277 | 11/1973 | Pompei | 324/687 |
| 4,349,862 | 9/1982 | Bajorek | 174/258 |
| 4,565,966 | 1/1986 | Burr | 324/519 |
| 4,567,542 | 1/1986 | Shimada | 361/321 C |
| 4,583,042 | 4/1986 | Riemer | 324/519 |
| 4,685,033 | 8/1987 | Inoue | 174/258 |
| 4,829,238 | 5/1989 | Goulette | 324/158 P |
| 4,956,611 | 9/1990 | Maltiel | 361/321 C |
| 5,017,863 | 5/1991 | Mellitz | 324/158 D |
| 5,138,266 | 8/1992 | Stearns | 324/158 R |

FOREIGN PATENT DOCUMENTS

| 0199173 | 8/1989 | Japan | 324/519 |
|---|---|---|---|

OTHER PUBLICATIONS

EDN-:News Breaks, "Capacitance test finds circuit-board opens". Edited by Susan Rose, Feb. 18, 1993, p. 17.

*Primary Examiner*—Andrew Faile

[57] ABSTRACT

An electronic device includes a substrate (200) for supporting electrical circuits (202), the substrate (200) including first and second opposing surface areas (204 and 206). At least first and second electrical contacts (214 and 216) are disposed on the substrate 200 and are electrically coupled to at least first and second conductive plates (210 and 212), respectively. The first and second conductive plates (210 and 212) are disposed on the first and second opposing surface areas (204 and 206) of the substrate (200), respectively. Preferably, the first and second conductive plates (210 and 212) at least partially overlap with each other. The first and second conductive plates (210 and 212) form a capacitive element therebetween for determining excessive variability in composition of the substrate as indicated by a measured inherent capacitance of the substrate at the capacitive element that is outside a specified tolerance of the capacitive element (200).

11 Claims, 3 Drawing Sheets

METHOD AND APPARATUS FOR MEASURING THE INHERENT CAPACITANCE OF A CIRCUIT SUPPORTING SUBSTRATE

This is a division of application Ser. No. 07/786,675, filed Nov. 1, 1991, abandoned.

FIELD OF THE INVENTION

This invention relates in general to the field of testing circuit supporting substrates, and more specifically to measuring the electrical characteristics of circuit supporting substrates by measuring the inherent capacitance thereof.

BACKGROUND OF THE INVENTION

Circuit supporting substrates (e.g., printed circuit boards, multilayer circuit boards, integrated circuit structures, and the like) are commonly used today in electronic products to enhance the manufacturing and servicing thereof. Further, modern electronic communication devices, such as selective call receivers, are becoming smaller, lighter, and more compact to meet customer demands. As the size of these electronic products is significantly reduced, the variability in the mechanical tolerances and in the composition of the circuit supporting substrates can seriously impact the operation of the electronic circuits disposed thereon.

A significant problem is the inherent capacitance or stray capacitance generated by electrical conductors disposed on opposing surfaces of a circuit supporting substrate. The circuit supporting substrate acts as a dielectric between the overlapping portions of the electrical conductors such that a capacitive element is introduced between the respective electronic circuits that are coupled to the overlapping conductors. This stray capacitance is normally not part of the electronic design of the circuits. But, it must be accounted for and dealt with to obtain proper operation of the manufactured electronic product.

Regrettably, the inherent or stray capacitance can vary between manufacturing lots of a vendor of circuit supporting substrates. Variations of up to 50% from vendor to vendor have been measured. This significant variability in the manufacturing process of circuit supporting substrates can seriously impact the operation of the electronic circuits disposed thereon. In modern electronic communication devices that rely on high frequency tuned circuits, small changes in the dimensions of the circuit supporting substrate or the electrical conductors disposed on opposing surfaces thereof can degrade the overall operation. Such critical operational parameters as page sensitivity for a paging receiver, the warping range of an oscillator, and the tuning range of an antenna can be seriously degraded. Moreover, a significant change in the inherent capacitance of a new batch of circuit supporting substrates typically necessitates re-matching the electrical components of the high frequency tuned circuits for proper operation thereof. This adds costs, inefficiencies, and potential quality problems to the manufacturing process of the electronic communication device.

Further, conventional visual inspection methods and techniques are not always sufficient to reliably determine the tolerances of the manufacturing process of circuit supporting substrates. First, in multilayer boards, which is the industry trend, the inner layers are not fully accessible for visual inspection. Second, the variability in composition of the substrate material is not always determinable from external visual inspection. Third, the direct electrical measurement of inherent capacitance is clearly a superior indication of the electrical characteristics of the circuit supporting substrate that affect the operation of the electronic circuits. Lastly, visual inspection is a less reliable and repeatable process than direct electrical measurement of the inherent capacitance of the circuit supporting substrate, which is an important consideration for automating the inspection process.

Thus, what is necessary is a method and apparatus for reliably measuring the inherent capacitance of circuit supporting substrates.

SUMMARY OF THE INVENTION

In carrying out one form of this invention, there is provided an electronic device comprising a substrate for supporting electrical circuits, the substrate comprising first and second opposing surface areas, at least first and second electrical contacts disposed on the substrate, and at least first and second conductive plates disposed on the first and second surface areas, respectively, and also electrically coupled to the at least first and second electrical contacts, respectively, the first and second conductive plates forming a capacitive element therebetween for determining excessive variability in composition of the substrate as indicated by a measured inherent capacitance of the substrate at the capacitive element that is outside a specified tolerance of the capacitive element.

DESCRIPTION OF A PREFERRED EMBODIMENT

Figure 1:
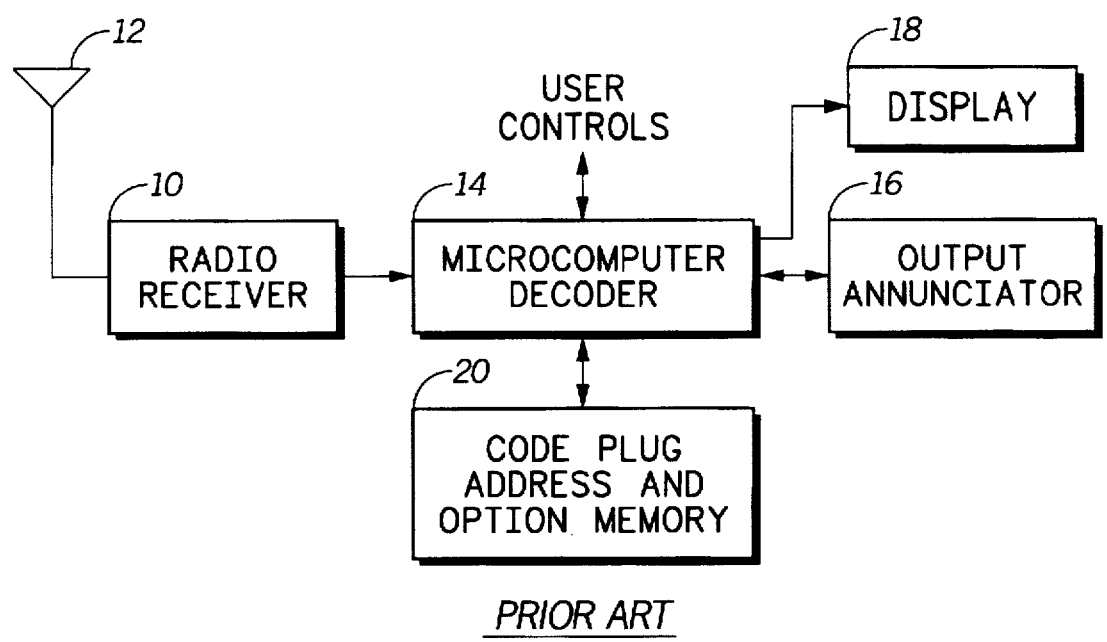
FIG. 1 is a block diagram of a selective call receiver.

FIG. 1 is a block diagram of an electronic device, such as a selective call receiver, e.g. a paging receiver. It includes radio receiver circuitry 10 which receives signals via an antenna 12. The output of the radio receiver circuitry 10 is applied to a microcomputer decoder 14 which processes the information contained in the received signals. As can be seen, the microcomputer decoder 14 communicates with an output annunciator 16, a display 18, and a code plug address and option memory 20. The user can activate user controls, such as buttons or switches, to invoke functions in the pager. The operation of a paging receiver of the type shown in FIG. 1 is well known and is more fully described in U.S. Pat. No. 4,518,961, issued May 21, 1985, entitled "Universal Paging Device with Power Conservation."

Figure 2:
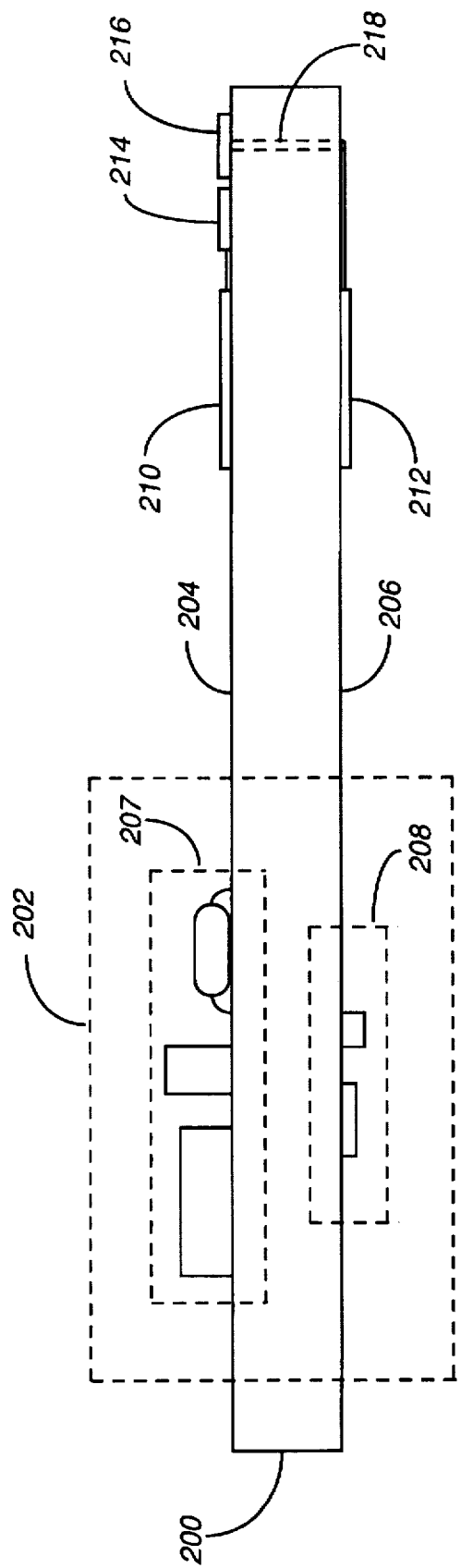
FIG. 2 is a side view of a circuit supporting substrate according to a first embodiment of the present invention.

FIG. 2 is a side view of a circuit supporting substrate 200 according to a first embodiment of the present invention. This type of substrate 200 is capable of supporting electrical circuits 202 in an electronic device, such as the selective call receiver shown in FIG. 1. The substrate 200 comprises at least first and second opposing surface areas, 204 and 206. Preferably, these surface areas are also substantially parallel to each other. Electrical circuits 207 and 208 can be disposed on either surface area, 204 or 206, or on both surface areas, 204 and 206, using known circuit layout and manufacturing techniques.

Two electrical contacts, 214 and 216, are disposed on at least one side of the substrate 200. Preferably, the electrical contacts are grouped in an otherwise unused surface area on one side of the substrate 200. This arrangement facilitates measuring the substrate's inherent capacitance during a manufacturing process and also during servicing of the electronic device, as will be more fully discussed below.

Two conductive plates 210 and 212 are disposed on the first and second surface areas 204 and 206, and are electrically coupled to the two electrical contacts 214 and 216, respectively. Preferably, runners on the circuit supporting substrate 200 electrically couple the two conductive plates with the corresponding two electrical contacts 214 and 216. Because the conductive plate 212 is on the opposite surface 206 to that of the two electrical contacts 214 and 216, a feed-through or via hole 218 electrically couples the corresponding electrical contact 216 with the conductive plate 212. The construction of feed-through holes for electrical interconnection is well known in the art. Preferably, the conductive plates 210 and 212, the electrical contacts 214 and 216, and the electrical interconnection circuits 218 are manufactured onto the substrate 200 using conventional mass manufacturing methods and techniques. Additionally, all of these are preferably constructed of a metallic material, such as copper.

Further, the two conductive plates 210 and 212 are preferably at least partially overlapping with each other in a plane substantially perpendicular thereto to form a capacitive element therebetween. Alternatively, the conductive plates 210 and 212 do not have to necessarily overlap to measure an inherent capacitance of the substrate 200. The capacitive element is normally formed by the dielectric material of the substrate 200 between the two conductive plates 210 and 212. The measured capacitance of this capacitive element is a useful parameter that indicates the inherent capacitance of the substrate 200.

With this substrate arrangement in a manufacturing environment, a technician is capable of quickly determining whether a substrate 200 meets specified tolerances for inherent capacitance. By applying a measuring device, such as a capacitance meter or an impedance meter, at the electrical contacts 214 and 216, the technician can perform a simple "pass or fail" test on the substrate 200. The technician can also perform this test on multiple pairs of "test points" on the substrate 200, e.g. other pairs of electrical contacts, to acquire a more comprehensive set of measurements to characterize the substrate 200. Typically, a substrate that fails the test makes the entire batch or lot it came from suspect of similar defects. By testing the substrate 200 before any substantial manufacturing of the electronic device takes place, the manufacturing process can circumvent significant manufacturing costs and quality problems later on.

As part of a design for manufacturability, a designer can model the electrical circuits 202, designing the operational tolerances of the electrical circuits 202 for a specified inherent capacitance of the substrate 200. Subsequently, the specified inherent capacitance value within some tolerances becomes a parameter for the manufacturing process of substrates that are capable of supporting the electrical circuits 202. In this way, the electrical circuits 202 and the inherent capacitance of the substrates are matched for a manufacturing process.

Furthermore, by tracking the inherent capacitance of substrates within a manufacturing lot, and also from lot to lot, early detection of a significant variability from the specified inherent capacitance is possible. Significant changes in the measured inherent capacitance from substrate to substrate within a lot, or from lot to lot, can indicate a number of manufacturing problems. Some of these problems are discussed below.

First, changes in the inherent capacitance from substrate to substrate can signal excessive variability in the composition of the dielectric material of the substrate 200, or in the composition of layers in a multilayer substrate. For example, a material composition of the substrate 200 may comprise at least one of the compounds Polyimid or FR4. A change in the composition may affect the inherent capacitance of the substrate 200. Additionally, a change in the moisture content of a substrate material in a manufacturing process can also change the measured inherent capacitance of the manufactured substrate.

Second, this measurement may indicate that the layers in a multilayer substrate are improperly superposed on each other. In a four layer printed circuit board, for example, the two inner layers may be interchanged without clear visual indication of the defect. If the defect is detected after the electrical circuit 202 is disposed on the substrate 200, it typically becomes expensive to repair. This expense is magnified in a mass manufacturing environment where large quantities may be manufactured before the defect is detected.

Third, it may indicate excessive variability in the dimensions of the conductors disposed on the substrate, and other related problems. In a printed circuit board, for example, the runners may be over-etched or under-etched, or the dimensions of the laminate material of the substrate may be outside of specification.

Lastly, the inherent capacitance parameter clearly indicates an important electrical characteristic of the substrate 200 that affects the electrical performance of a product. Particularly with electrical circuits 202 operating at very high frequencies, such as with radio frequency signals, the inherent capacitance or stray capacitance of the substrate 200 introduces a capacitive element in the electrical design. Significant variability of this capacitive element from a specified tolerance can seriously impact the operation of the electrical circuits 202 disposed on the substrate 200. For example, measurements of a paging receiver have shown a direct correlation between a change in the inherent or stray capacitance of the substrate 200 and a change in such critical operational parameters as page sensitivity for the paging receiver, the warping range of an oscillator, and the tuning range of an antenna. Unfortunately, these types of operational parameters are usually measured after the final assembly of the finished product. To make matters worse, typically a large number of finished products have similar defects due to a defective lot of substrates. Hence, detection of the defect at this late stage of manufacturing is very expensive to correct.

Therefore, by measuring the inherent capacitance of substrates within a manufacturing lot, or from lot to lot, and taking early corrective actions, many of the aforementioned manufacturing problems may be avoided. Technicians can reject defective substrates on the production line before significant assembly and other manufacturing takes place. This can remove the problem substrates before disposing the electrical circuits 202 thereon, and before committing to other significant manufacturing. This test procedure may therefore avoid substantial repair and scrap costs of the finished products, as well as enhance the overall quality thereof.

To measure the capacitance of the capacitive element formed between the conductive plates 210 and 212, a test signal can be applied between the corresponding electrical contacts 214 and 216. In a 280 MHz paging receiver, the test signal preferably comprises a frequency in the very high frequency range, such as 280 MHz. However, other frequencies, such as 900 MHz, may be more appropriate for other applications. The frequency of the test signal is normally selected within the operational frequencies of the particular design of the electrical circuit 202. Measurement devices, such as the Hewlett Packard HP 4192 impedance meter, can provide the measurement at the specified test signal frequency.

In a manufacturing environment, a test fixture (not shown) having probe pins or similar electrical contacting structures, preferably electrically couples the measurement device, such as the HP 4192, and the electrical contacts 214 and 216 on the substrate 200. This facilitates the measurement procedure and assures consistent and repeatable testing from substrate to substrate.

The measured inherent capacitance determines whether the substrate passes or fails the test. That is, this test qualifies the substrate in the manufacturing process. As long as the measurement is within specified tolerances from a nominal value, the substrate 200 passes the test. However, a substrate 200 having a measured inherent capacitance that is outside acceptable tolerances fails the test. Rejection of a substrate 200 due to failing the inherent capacitance test makes the remaining lot of substrates suspect of similar defects. By monitoring the inherent capacitance parameter from substrate to substrate within a lot and from lot to lot, statistical data can characterize the substrate manufacturing process for a vendor. A vendor whose manufacturing process variability exceeds acceptable limits may be rejected. In this way, both the manufacturer of the substrates and the customer can independently monitor the manufacturing process and take early corrective action, if necessary.

Figure 3:
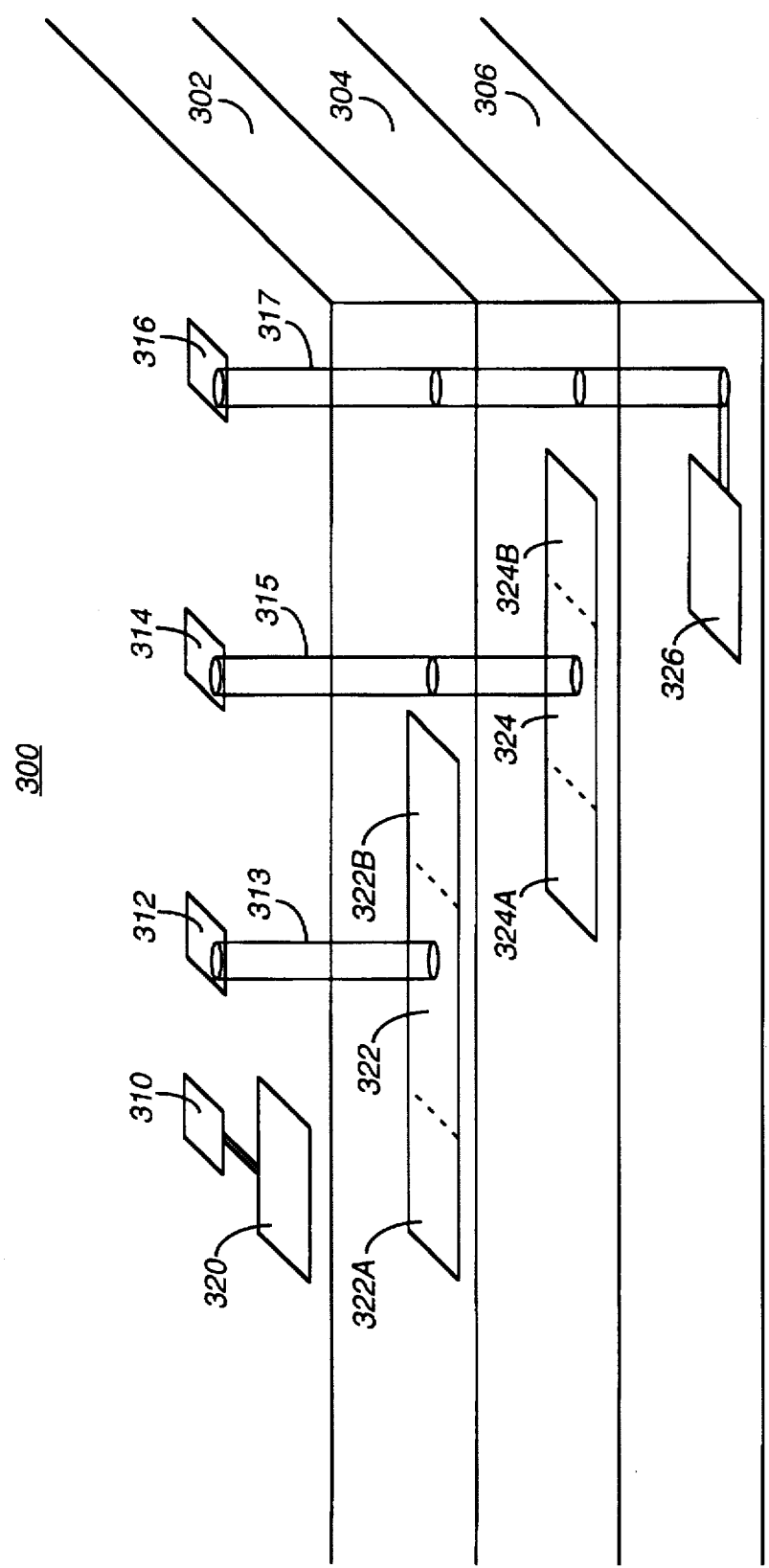
FIG. 3 is a transparent view of a multi-layer substrate according to a second embodiment of the present invention.

FIG. 3 is a transparent view of a multi-layer substrate 300 according to a second embodiment of the present invention. Specifically, the substrate 300 comprises three layers, 302, 304, and 306, superposed on each other. However, other embodiments of the present invention may include substrates comprising any number of layers, as may be appreciated by one skilled in the art.

Each one of the three layers, 302, 304, and 306, comprises two opposing surface areas. Preferably, these surface areas are also substantially parallel to each other. One of the two surface areas of the first layer 302 is contiguous to a corresponding one of the two surface areas of the second layer 304. Similarly, the other one of the two surface areas of the second layer 304 is contiguous to a corresponding one of the two surface areas of the third layer 306.

Four electrical contacts 310, 312, 314, and 316 are disposed on the top outer surface of the substrate 300. This arrangement may facilitate measuring the inherent capacitance of the substrate 300 by providing a group of test points 310, 312, 314, and 316 on one side of the substrate 300. The plurality of electrical contacts 310, 312, 314, and 316 is electrically coupled to a plurality of conductive plates 320, 322, 324, and 326, respectively. Clearly, each conductive plate is electrically coupled to a corresponding one of the plurality of electrical contacts 310, 312, 314, and 316. The conductive plates 322, 324, and 326 are electrically coupled to the electrical contacts 312, 314, and 316 by way of feed-through or via holes 313, 315, and 317, using known circuit layout and mass manufacturing techniques. This makes the additional cost of adding the circuit elements for testing the inherent capacitance of the substrate 300 virtually negligible.

The first conductive plate 320 is disposed on a surface area on the top outer surface of the substrate 300. The second and third conductive plates 322 and 324 are disposed on surface areas of the two lower layers 304 and 306, these conductive plates 322 and 324 being interposed between the first 302 and second 304 layers and the second 304 and third 306 layers, respectively. The fourth conductive plate 326 is disposed on a surface area on the bottom outer surface of the substrate 300. In this way, a number of capacitive elements are formed to measure the inherent capacitance of the substrate 300, as will be more fully discussed below.

Preferably, the second conductive plate 322 has additional conductive areas 322A and 322B. Likewise, the third conductive plate 324 preferably has additional conductive areas 324A and 324B. In this way, the four conductive plates 320, 322, 324, and 326 preferably at least partially overlap with each other in a plane substantially perpendicular thereto to form a stair step arrangement. The first conductive plate 320 overlaps the second conductive plate 322 at a portion of the conductive area 322A. Similarly, the second and third conductive plates 322 and 324 overlap with each other at the respective conductive areas 322B and 324A. Lastly, the fourth conductive plate 326 overlaps the third conductive plate 324 at conductive area 324B.

In this way, at least three capacitive elements are formed on the layers 302, 304, and 306, of the substrate 300. The first capacitive element comprises the conductive plates 320 and 322 having the dielectric material of the first layer 302 therebetween. The second capacitive element comprises the conductive plates 322 and 324 having the dielectric material of the second layer 304 therebetween. And, the third capacitive element comprises the conductive plates 324 and 326 having the dielectric material of the third layer 306 therebetween.

Additional capacitive elements may be available for measuring the inherent capacitance of the substrate 300. For example, the first and fourth conductive plates 320 and 326 form a capacitive element therebetween that can be measured to provide an inherent capacitance value for the substrate 300. In similar fashion, other combinations of the conductive plates 320, 322, 324, and 326 can be measured for inherent capacitance, such as the first and third conductive plates 320 and 324, and the second and fourth conductive plates 322 and 326. These additional measurements can provide a more comprehensive set of measurements to characterize the inherent capacitance of the substrate. Depending on the construction and layout of electrical circuits on the circuit supporting substrate 300, these additional measurements may be representative of the inherent capacitance of the substrate 300 affecting the operation of the electrical circuits thereon.

By selecting two of the plurality of electrical contacts 310, 312, 314, and 316, that correspond to two of the plurality of conductive plates 320, 322, 324, and 326, respectively, a capacitive element can be measured. Repetition of the measurement on other paired combinations of the electrical contacts or test points 310, 312, 314, and 316, yields a number of measurements of inherent capacitance of the substrate 300. These measurements when compared to specified tolerances provide parameters that may indicate the quality and the capability of the manufacturing process of the substrate 300. In this way, defects introduced during manufacturing of the substrate 300 can be reliably detected at an early stage in the manufacturing process.

Additionally, visual inspection may be combined with the electrical measurements of inherent capacitance to enhance the reliability of the overall testing process. The the plurality of conductive plates 320, 322, 324, and 326 can be arranged such that they are at least partially visible at an outer surface of the substrate 300. Their overlapping stair step arrangement can indicate certain manufacturing defects or lack thereof. For example, when the layers are improperly superposed on each other, such as layers two 304 and three 306 being swapped around during manufacturing, the lack of a visible stair step arrangement indicates this defect to a technician. Hence, the conductive plates can serve multiple purposes, providing a facility for electrical testing of the inherent capacitance and also providing a means for visually inspecting the substrate 300 for certain manufacturing defects.

Optimally, the aforementioned electrical testing procedure can be automated in a manufacturing environment. The manufacturing process may be additionally streamlined by monitoring the inherent or stray capacitance parameter of manufactured substrates along with other more conventional measurements, such as testing for "opens" or "shorts" on the substrates. Thus, an efficient and reliable method for measuring the inherent capacitance of substrates is provided.

What is claimed is:

1. An electronic device comprising:

a substrate for supporting electrical circuits, the substrate comprising first and second opposing surface areas;

at least first and second electrical contacts disposed on the substrate; and at least first and second conductive plates disposed on the first and second surface areas, respectively, and also electrically coupled to the at least first and second electrical contacts, respectively, the first and second conductive plates forming a capacitive element therebetween for determining excessive variability in composition of the substrate as indicated by a measured inherent capacitance of the substrate at the capacitive element that is outside a specified tolerance thereof.

2. The electronic device of claim 1, wherein the capacitive element facilitates measurement of the inherent capacitance of the substrate for determining excessive variability in moisture content of the composition of the substrate as indicated by the measured inherent capacitance of the substrate being outside the specified tolerance thereof.

3. The electronic device of claim 1, wherein the first and second conductive plates at least partially overlap with each other in a plane substantially perpendicular thereto to form the capacitive element therebetween.

4. The electronic device of claim 1, wherein the substrate comprises a printed circuit board, and the at least first and second conductive plates being disposed on first and second surface areas of the printed circuit board forming the capacitive element therebetween to facilitate measurement of the inherent capacitance of the printed circuit board for determining the excessive variability in composition of the printed circuit board as indicated by the measured inherent capacitance of the printed circuit board at the capacitive element that is outside the specified tolerance thereof.

5. The electronic device of claim 1, wherein the electronic device is a selective call receiver comprising radio receiver circuits at least partially disposed on the substrate.

6. The electronic device of claim 1, wherein the substrate is a multilayer substrate comprising a plurality of layers, each of the plurality of layers comprising two opposing surface areas, and wherein the first and second opposing surface areas are the two opposing surface areas of one of the plurality of layers.

7. A selective call receiver comprising:

a substrate for supporting radio receiver circuits, the radio receiver circuits capable of receiving a message, the substrate comprising a plurality of layers superposed on each other, each layer comprising two opposing surface areas;

decoding means coupled to the radio receiver circuits for decoding the received message;

presenting means coupled to the decoding means for presenting the decoded message;

a plurality of electrical contacts disposed on at least one outer surface of the circuit supporting substrate; and a plurality of conductive plates, each conductive plate electrically coupled to a corresponding one of the plurality of electrical contacts, and arranged on corresponding one of the plurality of layers of the circuit supporting substrate, first and second conductive plates of the plurality of conductive plates forming a capacitive element therebetween for determining excessive variability in the composition of the circuit supporting substrate as indicated by a measured inherent capacitance of the circuit supporting substrate that is outside a specified tolerance thereof.

8. The selective call receiver of claim 7, wherein the capacitive element facilitates measurement of the inherent capacitance of the circuit supporting substrate for determining determines excessive variability in moisture content of the composition of the circuit supporting substrate as indica ed by the measured inherent capacitance of the circuit supporting substrate being outside the specified tolerance thereof.

9. The selective call receiver of claim 7, wherein the first and second conductive plates at least partially overlap with each other in a plane substantially perpendicular thereto to form the capacitive element therebetween.

10. The selective call receiver of claim 7, wherein the substrate comprises a printed circuit board.

11. The selective call receiver of claim 7, wherein first and second electrical contacts of the plurality of electrical contacts are electrically coupled to the first and second conductive plates, respectively, and wherein the first and second electrical contacts can receive at least one radio frequency signal for electrically coupling the at least one radio frequency signal to the respective first and second conductive plates for measuring the inherent capacitance of the circuit supporting substrate with respect to the at least one radio frequency signal for determining the excessive variability in composition of the circuit supporting substrate as indicated by the measured inherent capacitance of the circuit supporting substrate being outside the specified tolerance thereof.

* * * * *